United States Patent [19]

Brown et al.

[11] Patent Number: 4,730,198

[45] Date of Patent: Mar. 8, 1988

[54] ALIGNING ARRAYS OF OPTOELECTRONIC DEVICES TO ARRAYS OF OPTICAL FIBERS

[75] Inventors: Michael G. Brown, Berkeley Heights; Stephen R. Forrest, Chatham; Daniel R. Kaplan, Springfield; Paul A. Kohl, Chatham; Yusuke Ota, Mountain Lakes; Harvey S. Trop, South Plainfield, all of N.J.

[73] Assignee: American Telephone and Telegraph Company, AT&T Bell Laboratories, Murray Hill, N.J.

[21] Appl. No.: 674,681

[22] Filed: Nov. 26, 1984

[51] Int. Cl.$^4$ ................................................ G02B 6/36
[52] U.S. Cl. ............................. 350/96.20; 350/96.22
[58] Field of Search ............... 350/96.20, 96.21, 96.22, 350/96.15; 250/227

[56] References Cited

U.S. PATENT DOCUMENTS

| 4,373,778 | 2/1983 | Adham | 350/96.20 |
| 4,414,066 | 11/1983 | Forrest et al. | 204/129.3 |
| 4,512,627 | 4/1985 | Archer et al. | 350/96.20 |
| 4,553,811 | 11/1985 | Becker, deceased et al. | 350/96.20 |
| 4,611,886 | 9/1986 | Cline et al. | 350/96.20 |

FOREIGN PATENT DOCUMENTS 9110 1/1983 Japan ........................... 350/96.15

OTHER PUBLICATIONS

Cefarelli et al., IBM Tech. Disc. Bulletin, 21(4), Sep. 1978, "Optical Circuit Module Connector", pp. 1568-1570.

Noel et al., IBM Tech. Discl. Bulletin, 22(11), Apr. 1980, "High Density Fiber-Optic Transducer Modules", pp. 4857-4858.

Balliet et al., IBM Tech. Discl. Bulletin, 25(8), Jan. 1983, "Coined Block for Self-Aligning Edge Emmiters to Fiber", pp. 4258-4260.

Albanese et al., Bell System Tech. Journal, 58(3), Mar. 1979, "LED Array Package for Optical Data Links", pp. 713-720.

"Low Dark-Current, High-Efficiency Planar $In_{0.53}Ga_{0.47}As/InP$ P-I-N Photodiodes", IEEE Electron Device Letters, vol. EDL-2, No. 11, p. 283, Nov. 1981, S. R. Forrest et al.

"Accurate Silicon Spacer Chips for an Optical-Fiber Cable Connector", The Bell System Technical Journal, vol. 57, No. 1, pp. 91-97, Jan. 1978, C. M. Schroeder.

Primary Examiner—William L. Sikes
Assistant Examiner—Frank González
Attorney, Agent, or Firm—Michael J. Urbano

[57] ABSTRACT

Linear arrays of optical fibers are aligned to linear arrays of optoelectronic devices (e.g., photodiodes, diode lasers or LEDs) formed on an elongated chip. The alignment procedure results in a subassembly which includes fiber segments embedded between V-groove mounting blocks and the device array chip affixed to an end face of the blocks.

11 Claims, 6 Drawing Figures

ALIGNING ARRAYS OF OPTOELECTRONIC DEVICES TO ARRAYS OF OPTICAL FIBERS

BACKGROUND OF THE INVENTION

This invention relates to the alignment of optical fibers to optoelectronic devices and, more particularly, to the alignment of arrays of fibers to arrays of devices.

Workers worldwide are giving considerable attention to the problem of monolithically integrating various types of optoelectronic devices on a single substrate. The integration of linear arrays of photodetectors (e.g., photodiodes) and linear arrays of light emitters (e.g., laser diodes or LEDs) represents one area of particular interest. Such integrated device arrays would be useful, for example, in parallel data-bus transmission and in high fiber density applications. In addition, new fiber-optic system architectures are made possible by the use of such arrays. For example, the spatial multiplexing envisioned by a video switch having hundreds, if not thousands, of input/outputs would be too bulky if constructed of discrete devices but considerably more compact and practical if made from monolithic arrays.

However, a continuing problem encountered in the packaging of optoelectronic devices for use in fiber-optic lightwave communication sytems is the alignment of optical fibers to the optically active region of these devices. Alignment tolerances are typically on the order of 10–20 $\mu$m for multimode systems and are considerably smaller for single mode systems. Most alignment schemes are performed actively; i.e., a photogenerated electrical response is maximized as a function of the position of the fiber with respect to the device's active region. Although this method can in principle be automated, it is a complex procedure. In present manufacturing processes this alignment scheme requires a considerable amount of time by a skilled technician. The problems with alignment are exacerbated with arrays of devices because of the increased number of fibers which must be simultaneously aligned to the devices.

SUMMARY OF THE INVENTION

In accordance with one aspect of our invention, a subassembly for arrays of optoelectronic devices includes a mount having a pair of essentially parallel end faces. A plurality of optical fiber segments is embedded in the mount with at least one set of fiber ends being essentially flush with one of the end faces, thereby forming a uniformly spaced linear array of the fiber ends. Affixed to that end face is an elongated optoelectronic chip which includes a linear array of optoelectronic devices which have essentially the same spacing as the fiber ends. The chip is positioned so that each device is aligned and optically coupled to a separate fiber end. The other end face of the mount may be optically coupled to a fiber ribbon cable. Since one side of the chip is affixed to the mount, the other side of the chip preferably has patterned metallization which allows at least two-terminal electrical connections to be made to the devices.

Another aspect of our invention relates to the procedures for effecting fiber-to-device alignment. In a preferred technique, an alignment jig is assembled utilizing a base having an array of parallel grooves and an abutment positioned at one end of the grooves and transverse thereto. The mount, with the fiber segments embedded therein, also has on an exterior major surface parallel grooves which are complementary to those of the base so that the two pieces can interlock with one another. With one end face of the mount against the abutment, the chip is positioned on that end face and is pushed against the abutment. The center-to-center spacing of the devices is made to be essentially equal to that of the fibers. In addition, the height of the abutment is predetermined so that in the abutted position the active regions of the devices are aligned in one dimension (perpendicular to the line of the fiber ends) with the cores of the fibers. Alignment in the orthogonal dimension (parallel to the line of the fiber ends) can be achieved optoelectronically by maximizing a photogenerated signal or optomechanically by microscopically positioning one of the device active regions over one of the fiber cores.

Alignment in the latter orthogonal dimension can also be achieved by a purely mechanical arrangement, however, in accordance with another embodiment of our invention. In this case, at least one long edge of the chip is serrated so as to form an array of grooves which are complementary to a corresponding array of grooves on the top edge of the abutment. Since all arrays of grooves, fibers and devices have essentially the same center-to-center spacing, pushing the serrated edge of the chip against the wall automatically effects fiber-to-device alignment.

BRIEF DESCRIPTION OF THE DRAWINGS

Our invention, together with its various features and advantages, can be readily understood from the following, more detailed description taken in conjunction with the accompanying drawing, in which the figures are not drawn to scale in the interests of clarity.

DETAILED DESCRIPTION

Packaged Assembly

Figure 1:
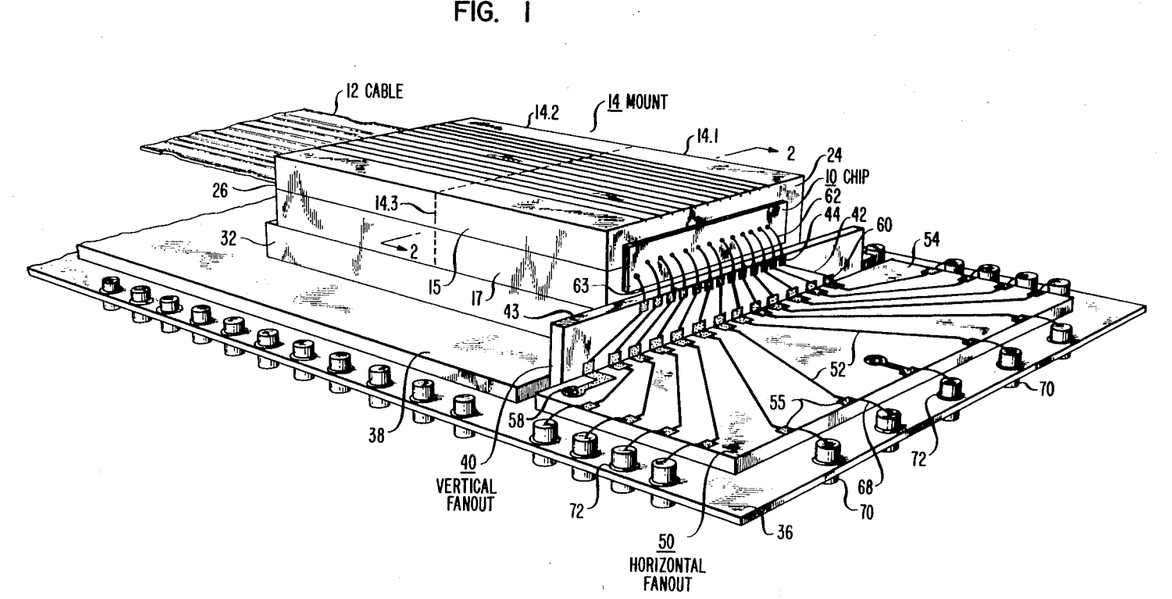
FIG. 1 is an isometric view of a packaged assembly in which an elongated optoelectronic chip, which includes, for example, a linear array of photodiodes, is coupled to a fiber ribbon cable in accordance with one aspect of our invention.
Figure 2:
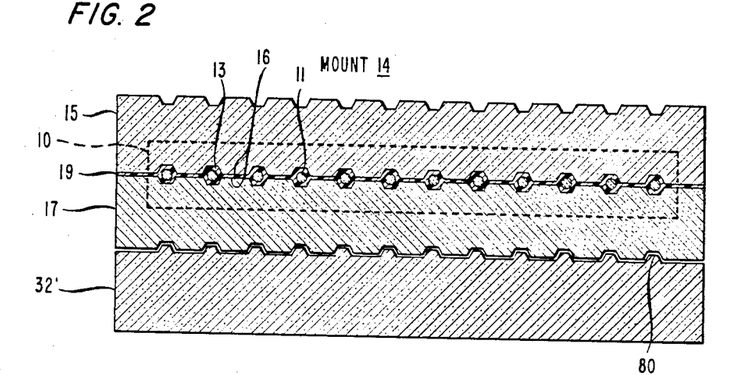
FIG. 2 is a partial cross section taken along line 2—2 of FIG. 1.
Figures 5, 5B:
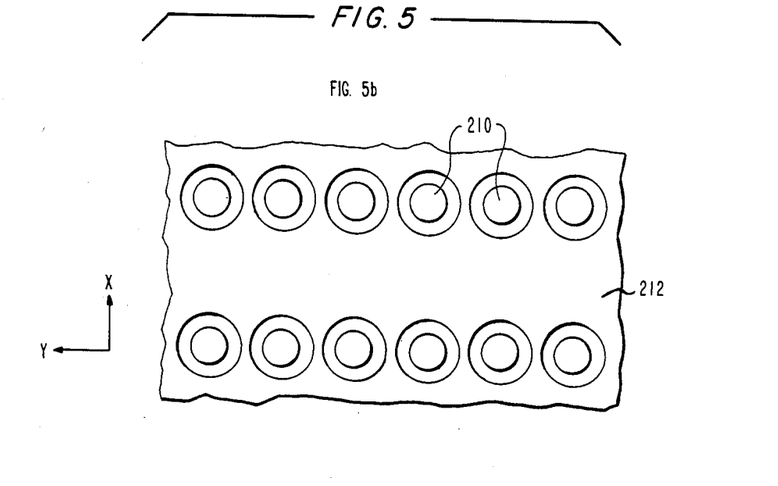
FIG. 5 shows schematically a cross-sectional view, Part (a), and a top view, Part (b), of a photodiode array for use in the packaged assembly of FIG. 1.
Figure 5A:
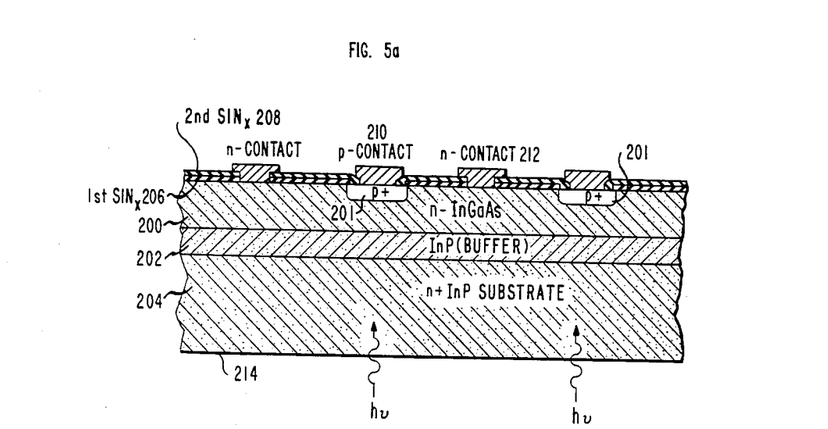

With reference now to FIGS. 1 and 2, a packaged assembly includes an elognated optoelectronic chip 10, illustratively a monolithic linear array of p-i-n, back-illuminated photodiodes of the type depicted in FIG. 5a, which is coupled to a fiber ribbon cable 12. End segments 11 of the cable fibers are embedded in a mount 14 which has opposing end faces 24 and 26. The ends of the fibers are essentially flush with the end face 24 and themselves form a linear array as shown in FIG. 2. More specifically, the mount 14 includes a grooved upper block 15 and an essentially identical grooved lower block 17 which are bonded together by an adhesive layer 19 between facing major surfaces 16. The grooves 13, which are V-shaped or trapezoidal in cross section, extend parallel to one another in the facing major surfaces 16. The optoelectronic chip 10 is affixed to end face 24 of the mount 14 whereas the other end face 26 is coupled to cable 12 e.g., the cable fibers are embedded in mount 14 and exit out of end face 26 in a continuous manner). The active regions of the devices on the chip 10 are aligned to the fibers 11 by the techniques described hereinafter.

Electrical connections to the chip 10 are made via a vertical fanout 40 and a horizontal fanout 50 both of which are affixed to a metal header 36. Each fanout includes an array of wire lines 42 and 52 deposited on electrically insulative members 43 and 54, respectively. The sets of wire lines on the two orthogonal fanouts are illustratively connected via L-shaped tabs 60 which are located at the right-angle interface between the fanouts. Wire bonds 62 connect one set of contacts on the chip 10 (e.g., the p-side contacts 210 of FIG. 5) to the row of metal pads 44 along the top edge of vertical fanout 40. Wire lines 52 connect the L-shaped tabs 60 to metal pads 55 at the periphery of horizontal fanout 50, and the latter are connected via wire bonds 68 to metal posts 70 at the periphery of the header 36. The posts 70 are insulated by glass beads 72 from the header.

On the other hand, wire bond 63 is connected to the other device contact (e.g., the n-side contact 212 of FIG. 5) and to a ferrule 58 (e.g., a metallized hole) which extends through the horizontal fanout 50 and contacts the metallized back of member 54. Typically, therefore, wire bond 63 electrically grounds the devices of chip 10. This arrangement is only one of many possible configurations and may not be optimal for some lightwave receiver applications. For example, the horizontal fanout may be electrically isolated from the header.

Presently available grooved blocks 15 and 17 are only about 30 mils thick, whereas vertical fanout 40 may be 75 mils high. Consequently, to add height to mount 14 and position the horizontally-oriented chip 10 above the fanout 40, the mount 14 rests on a planar top surface of support piece 32. Piece 32 is affixed to header 36 via an optimal insulative member 38 and is also affixed to the back side of vertical fanout 40.

In accordance with another embodiment of our invention, the support piece 32 may also serve an alignment function. In this case, the mount 14 is actually composed of two submounts: a cable submount 14.2 and a chip submount 14.1, hence the dotted line 14.3 of FIG. 1. The blocks of the submounts are essentially identical to one another, but only end portions of the fibers of cable 12 are embedded in the cable submount 14.2, whereas separate, short fiber segments are embedded in chip submount 14.1. Thus, the chip submount 14.1 may be manufactured, sold and used as a separate subassembly in other applications which may or may not involve coupling to a fiber ribbon cable.

In the cable-to-chip couplings scheme, however, the fibers in the two submounts need to be aligned with one another. To this end, the top surface of the support piece, in this embodiment depicted as 32′ in FIG. 2, is provided with an array of parallel grooves which are complementary to the parallel grooves on the bottom surfaces of the lower blocks (i.e., complementary to grooves 80 in the bottom of block 17 of FIG. 2). The center-to-center spacing of the grooves in all of the blocks and the support piece is equal to the center-to-center spacing of devices. Thus, when the grooves of block 17 interlock with those of the support piece 32′, the fibers in the submounts 14.1 and 14.2 are aligned not only to one another but also to the devices.

Device-to-Fiber Alignment

Figures 3, 3A:
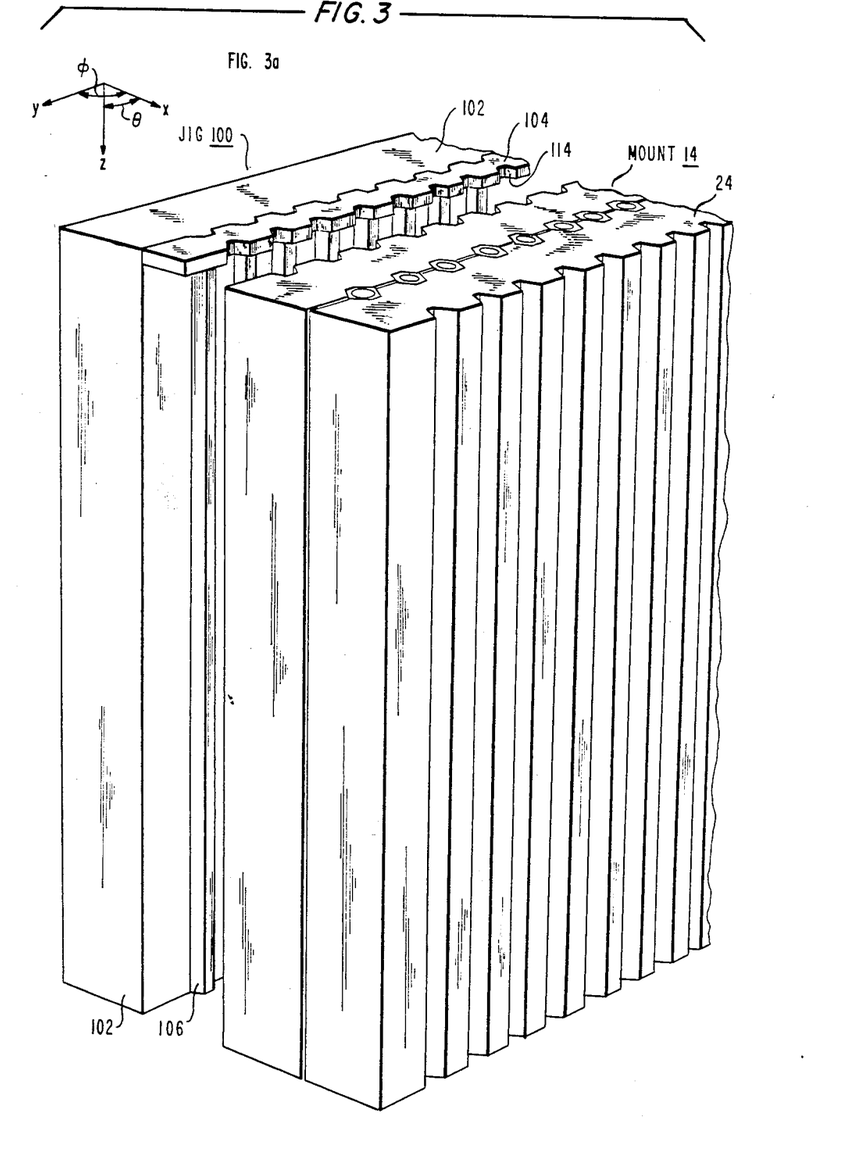
FIG. 3, Parts (a)–(d), show schematically an alignment jig and alignment sequence for mounting an elongated optoelectronic chip, which includes a linear array of devices, onto one end of a fiber mount.
Figure 3B:
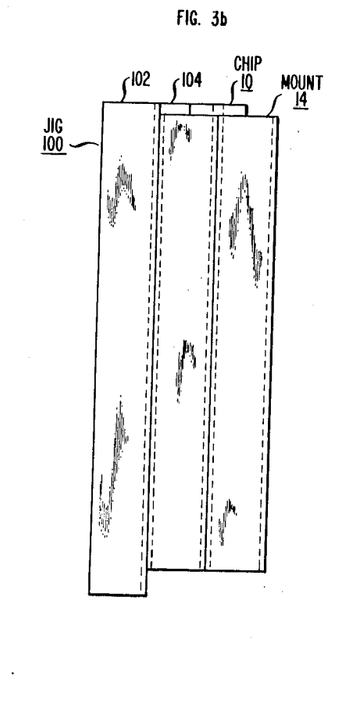
Figure 3C:
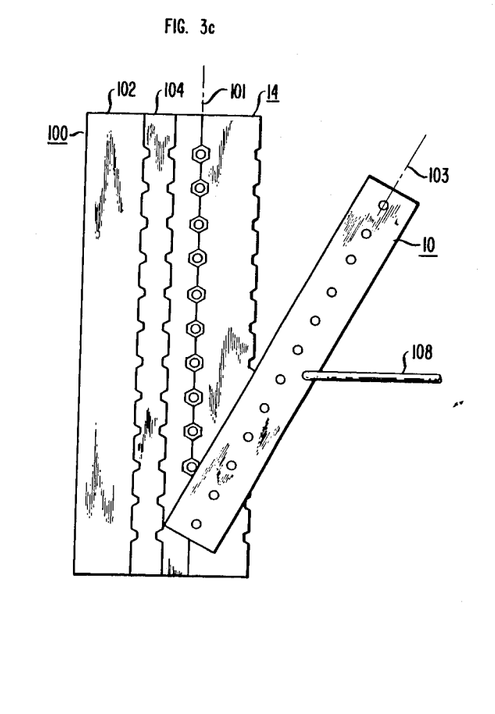

The device-to-fiber alignment aspect of our invention is best understood with reference to FIG. 3. First, an alignment jig 100 is asembled from a base 102 and an abutment 104. The base has on at least one major surface an array of parallel grooves 106 which are complementary to those of the grooved mount 14 (e.g., complementary to the grooves 80 of block 17 of FIG. 2). The abutment 104 is affixed to one end of the base 102 and transverse to the grooves 106. As with the mount 14, the base 102 is typically a grooved Si block well known in optical fiber connector art, and the abutment 104 is a thin slice (e.g., 150 μm thick) from a similar Si block but with complementary grooves. Thus, the abutment's grooves interlock with those of the base as shown in FIG. 3, Part (a).

Note, by making the chip 10 wider (by an amount equal to the width of the abutment 104), the abutment 104 could be eliminated. However, a wider chip 10 means that chip "read estate" would be wasted; i.e., few chips would be obtained from a given semiconductor wafer.

To position an optoelectronic chip 10 onto the end face 24 of mount 14 so that the active regions of the devices (open circles of chip 10 in Parts (c) and (d)) are aligned with the optical fibers (open circles of mount 14 in Parts (c) and (d)), the mount 14 is placed on grooves 106 of base 102 so that end face 24 is against abutment 104, as shown in Part (b). Then, the chip 10 is moved via a manipulator 108 (e.g., a vacuum pickup), placed on the end face 24 at an acute angle to abutment 104 as shown in Part (c), and rotated against the abutment 104 as shown in Part (d). The height h of the abutment is chosen so that in this position the fiber axis 101 and the device axis 103 are essentially parallel. The chip 10 is now slid against the abutment until each device in the chip is aligned with a separate fiber in the mount 14. Actually, aligning one device to its corresponding fiber aligns all devices to all fibers since the center-to-center fiber spacing is equal to the center-to-center device spacing.

The latter aligning step can be accomplished in several ways. A microscope line 110 may be initially aligned with one of the fibers, say the fourth from the top in Part (d), then the chip is slid until the fourth device is aligned with line 110. To alleviate possible parallax problems, the thicknesses (in the z-dimension) of the abutment 104 and the chip 10 are preferably, but not necessarily, equal. Alternatively, a photogenerated response may be maximized. Thus, if the devices are photodiodes, light may be coupled into one or more of the fibers and the photocurrent from one or more photodiodes may be monitored to determine the maximum photocurrent and hence the aligned position. The latter technique may not be preferred because it entails first bonding wires to the chip in order to measure the electrical response.

Figure 4:
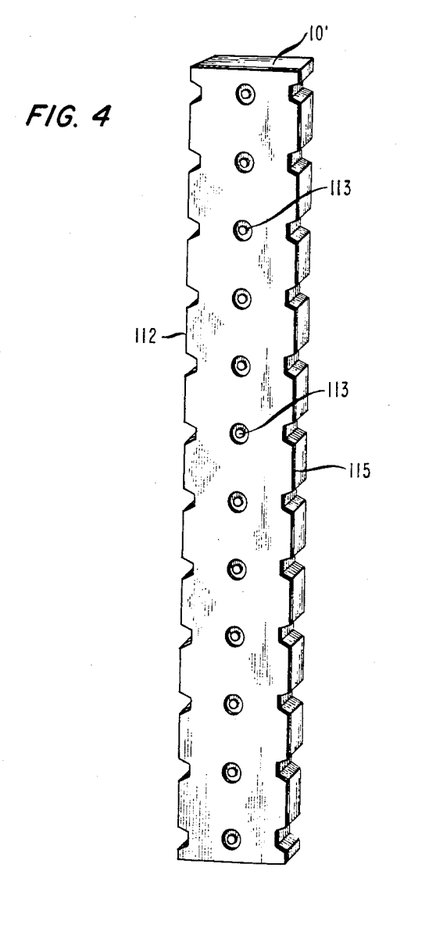
FIG. 4 shows schematically an elongated optoelectronic chip having serrated edges to facilitate alignment to a linear array of optical fibers.

Another alternative involves a further inventive aspect of our invention. In this case, the device chip 10′ as shown in FIG. 4 is provided with serrations on edge 112 which are complementary to the serrations (or grooves) along the top edge 114 of abutment 104. Once again the center-to-center fiber and device spacings are the same so that interlocking the chip 10′ with the abutment 104 automatically aligns the fibers to the devices. After alignment, the chip is held in place by application of transparent epoxy or solder between chip 10 and mount 14. Of course, soldering implies that the back of the chip 10 and the end face 24 are suitably metalized.

Serration of the edge of the chip may be achieved by a suitable photolithographically defined mask and photoelectrochemical (PEC) etching techniques well known in the art and described by S. R. Forrest, P. A. Kohl and R. L. Panock in U.S. Pat. No. 4,414,066.

In shaping the chip 10, the distance between the axis 103 and the elongated alignment edge of the chip which is against abutment 104 needs to be carefully controlled. In both of the embodiments (chips 10 and 10') this dimension is controlled photolithographically. For example, in FIG. 5b a line (not shown) may be photolithographically formed in the corridor between the rows of devices in order to guide saw cutting.

It should be noted that the alignment of a tiny elongated object, such as a chip with a large aspect ratio (e.g., 500 μm wide×3000 μm long), is a nontrivial task because the extremely light chips tend to rotate easily. In this regard, alignment in general entails control of five degrees of freedom, x, y, z, θ and φ. With reference to the coordinate axes shown in FIG. 3, the z-position is fixed by placing the chip on the end-face 24 of the mount; the x-position is fixed by holding the chip against the abutment 104 of predetermined height h which renders the fiber and device axes coplanar; the φ-orientation is also fixed by holding the chip against the abutment; the θ-orientation and the z-position are fixed by holding the chip against the end-face 24; and the y-position is fixed by any one of the three techniques described in the preceding paragraph.

The following examples are provided by way of illustration only. Specific materials, compositions, dimensions and other parameters are not intended to limit the scope of the invention.

EXAMPLE I

This example describes the fabrication of monolithically integrated, 1×12 arrays of $In_{0.53}Ga_{0.47}As/InP$ p-i-n photodiodes sensitive to optical radiation in the wavelength range of 0.95 μm to 1.65 μm. These devices are fully electrically and optically interfaced and are useful for fiber-optic system applications. The dark current of each diode at −5 V was <20 nA, and the total packaged capacitance for each device was ≦2.5 pF. The average external optical coupling efficiency was >80% at 1.3 μm for the diodes. These are, to our knowledge, the first such devices made for use in long-wavelength, optical fiber systems.

A schematic view of two devices of a linear array of 12 is shown in FIG. 5(a). The design of the individual photodiodes is similar to that of discrete, long-wavelength, back-illuminated detectors described by S. R. Forrest et al In *IEEE Trans. Electron. Dev. Lett.*, Vol. EDL-2, p. 283 (1981). The devices were processed from wafers which had a nominally undoped in $In_{0.53}Ga_{0.47}As$ layer 200, and an InP buffer layer 202 grown on a Sn-doped, n+-InP substrate 204 by trichloride vapor phase epitaxy. The carrier concentration in the ternary layer was <$10^{15}$ cm$^{-3}$. The p+n junctions 201 were formed by a closed-tube Zn-diffusion through a circular 90 μm diameter opening in the first $SiN_x$ layer 206. After diffusion, a second $SiN_x$ layer 208 was plasma-deposited, and a 50 μm opening was made to restrict the area of the p-contact away from the p+n junction. The dot-shaped p-contacts 210 and the circular-aperture n-contact 212 were formed by depositing Cr-Au onto the InGaAs surface through a suitable mask. Note, the p and n contacts are on the same surface, a design which facilitates making electrical contacts when the back surface 214 is affixed to the mount 14 (FIG. 1). Finally, the wafers were thinned to ≈6 mil before array separation.

On the wafer the photodetectors were on 250 μm centers (y-direction), and the rows were separated by 500 μm (x-direction), as shown in FIG. 5(b). The 250 μm distance was chosen to equal to the center-to-center spacing of optical fibers in silicon V-groove blocks, which are currently used to make fiber-ribbon splices, as described, for example, by C. M. Schroeder in *Bell System Technical Journal,* Vol. 57, page 91 (1978).

The position of an array within these rows (i.e., the particular devices which make up the array) was not defined on the wafer. Rather, the arrays were chosen out of these rows to maximize the array yield. In order to do this, 100 percent of the detectors were electrically tested at the wafer level. The dark current and the capacitance were measured on an automatic wafer prober at three voltages (−1 V, −5 V, and −10 V). After the data had been collected, maps of the dark current versus position on the wafer were generated for each measurement voltage. Devices which had a leakage current <$10^{-7}$ A at −5 V were considered suitable for arrays. Thus, the location of the arrays on the wafer was determined after the electrical tests were completed.

After testing, a precision, high-speed saw was used to separate the wafer into linear arrays which were identified using the above-described wafer-map. The alignment jig and procedure described with reference to FIG. 3 were used to position and epoxy the array onto one end face of a silicon V-groove fiber mount 14. In this manner, the active area of each photodiode was simultaneously aligned with a separate optical fiber and bonded onto the silicon V-groove mount. Alignment tolerance for this step was held at ±5 μm. A schematic diagram of the packaged device is shown in FIG. 1.

After the electrical tests were completed on the wafer, the discrete-device statistics were calculated. At a bias of −5 V the mean dark current was −28 nA, and the mean capacitance was 0.27 pF. In order to determine the coupling loss for packaged arrays, the external coupling efficiency was also measured for several devices at the wafer level. It was uniform across the wafer, and at λ=1.3 μm equaled 75%, corresponding to an internal quantum efficiency of ≧95%. These values were comparable to those of discrete photodiodes of this type.

After packaging, each photodiode in the array was individually tested. The dark current at −5 V varied from 10.9 nA to 15.8 nA. The full reverse I-V curve of each diode in the array was typical for a p-i-n diode of this material system. The capacitance to ground of the packaged diodes ranged from 1.87 pF to 2.52 pF. This value was determined mainly by the capacitance of the electrical fanout parts. Similarly, the value of the capacitance between adjacent diodes in the array, which is called the cross-talk capacitance ($C_x$) was ≦0.13 pF. The magnitude of $C_x$ was determined primarily by the package parts. Large values of $C_x$ lead to degradation of array performance at high bit rates due to interchannel reactive coupling. The average external optical copling efficiency for the array was 81% (77% lowest: 82% highest). This high coupling efficiency indicated that the array was accurately positioned on the silicon V-groove fiber mount.

EXAMPLE II

In this example, an elongated chip 10' of InP was provided with a serrated edge of the type identified as 112 in FIG. 4. The PEC metal mask remained on the chip as layer 115, but the mask did not include the dot contacts 113 because the chip contained no devices; i.e., in the interests of simplicity devices were omitted so that the feasibility of this alignment technique could be quickly demonstrated.

The mount 14 included two submounts, a ribbon cable submount 14.2 and a chip submount 14, which were abutted along the interface depicted by dotted line 14.3 of FIG. 1.

Figure 3D:
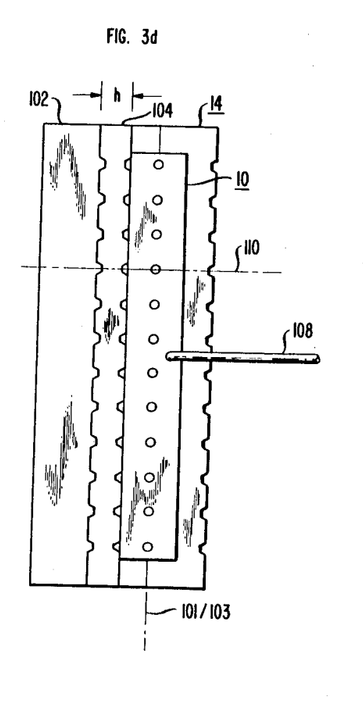

We now describe how the serrated edge on the chip 10' was used to align the positions of what would be photodiode active regions over the cores of the fibers. First, an alignment jig of the type shown in FIG. 3(a) was assembled. The serrations on the chip 10' were complementary to the serrations 114 (grooves) on the abutment 104, and the grooves, the fibers and the positions of the would-be devices all had the same center-to-center spacing. Next, the chip was positioned against the abutment as shown in FIG. 3(d) so that the grooves interlocked, thereby completely determining the position of the would-be devices relative to the fibers. While the sample was held against the abutment and the chip submount 14.1, it was bonded to the latter with epoxy. Finally, a fiber ribbon cable submount 14.2 was attached to the other polished surface of the submount 14.1 using standard fiber ribbon splicing techniques. The alignment jig was then removed.

The alignment jig and the submounts were made from silicon V-groove blocks well known in the art. The serrated edge 112 in the chip 10' was produced using photoelectrochemical (PEC) etching procedures of the type described by S. R. Forrest et al, supra. When using PEC etching, a photolithographically defined mask was deposited on the surface of the semiconductor to serve as a photomask during the etching. Since the shape of the etched well is determined by the light transmitted through the mask, the aspect ratio between the depth of the etch and the undercutting of the etched walls is very large (typically 30:1). The undercutting results from diffraction of light at the edges of the mask and from scattering of light by the well edges. Serrations have been successfully etched in (100) n-InP ($\approx 10^{18}/cm^3$) with a variety of mask materials including Au evaporated on a substrate or Pd-Au sputtered to thickness sufficient to block the light.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, two dimensional arrays of devices and fibers can be aligned in a similar fashion inasmuch as such an array is composed of subsets of linear arrays.

What is claimed is:

1. An optoelectronic assembly comprising
   a mount including first and second submounts each having a pair of essentially parallel end faces,
   a plurality of optical fiber segments embedded in said first submount with at least one set of fiber ends being essentially flush with one of said end faces and extending to said other end face, thereby forming a uniformly spaced, linear array of said set of fiber ends, and
   an elongated optoelectronic chip affixed to said one end face of said first submount, said chip including a linear array of optoelectronic devices which have essentially the same spacing as said set of fiber ends and being positioned so that each device is aligned and optically coupled to a separate open of said fiber ends, and
   a fiber ribbon cable abutting said other end face, the cable fibers being optically coupled to the fiber segments in said first submount,
   end portions of the cable fibers being embedded in said second submount so that the ends of said portions are essentially flush with one end face thereof, said one end face of said second submount being abutted against said other end face of said first submount so that the ends of the cable fibers and the ends of the segments are aligned with one another.

2. The assembly of claim 1 wherein the bottoms of said submounts are coplanar surfaces having an array of parallel grooves, and further including a base having a planar surface with a complementary array of grooves, the bottoms of said submounts being positioned on said base so that the arrays of grooves engage and align the fibers in said submounts to one another.

3. The assembly of claims 1 or 2 wherein at least one of the elongated edges of said chip is serrated to form grooves with essentially the same spacing as said fiber ends, said at least one serrated edge being used to align said devices to said fiber ends.

4. The assembly of claims 1, or 2 wherein said devices are photodiodes.

5. The assembly of claims 1 or 2 wherein said devices are light emitting diodes.

6. The assembly of claims 1, or 2 wherein said devices are diode lasers.

7. An optoelectronic package comprising
   a planar surface having a plurality of electrical contacts arranged along the periphery of said planar surface,
   an optoelectronic assembly comprising
      a mount having a pair of opposing end faces,
      a plurality of optical fiber segments embedded in said mount with at least one set of fiber ends being essentially flush with one of said end faces, thereby forming a uniformly spaced, linear array of said set of fiber ends, and
      an elongated optoelectronic chip affixed to said one end face, said chip including a linear array of optoelectronic devices which have essentially the same spacing as said set of fiber ends and being positioned so that each device is aligned and optically coupled to a separate one of said fiber ends,
   said assembly being mounted on said surface so that the elongated dimension of said chip is essentially parallel to said surface, and
   means for electrically connecting each of said devices to said contacts including,
      a vertical fanout comprising an elongated, planar, first electrically insulative member having one of its long edges mounted on said surface and parallel to said chip, a planar major surface of said first member having a first array of conductor lines formed thereon and connected to separate one of said devices, and a horizontal fanout comprising an elongated, planar, second electrically insulative member having a bottom major surface metallized and mounted on said planar surface and a top major surface with a second array of conductor lines formed thereon and connected between said first array of conductor lines and said contacts.

8. An optoelectronic assembly comprising
a mount having a pair of opposing end faces,
a plurality of optical fiber segments embedded in said mount with at least one set of fiber ends being essentially flush with one of said end faces, thereby forming a uniformly spaced, linear array of said set of fiber ends, and
an elongated optoelectronic chip affixed to said one end face, said chip including a linear array of optoelectronic devices which have essentially the same spacing as said set of fiber ends and being positioned so that each device is aligned and optically coupled to a separate one of said fiber ends,
wherein said devices are two-terminal devices and one major surface of said chip is affixed to said one end face of said mount and the opposite major surface of said chip has thereon separate metallization zones including an array of zones for separate connection to one of said terminals of each of said devices, and a common zone for common connection to the other of said terminals of all of said devices.

9. A method of aligning a linear array of optical fibers to a linear array of optoelectronic devices integrated on a single elongated chip comprising the steps of:
(a) embedding the fibers in a mount which has a pair of opposing end faces so that the fibers extend between the end faces and at least one set of fiber ends forms a linear array in one of the end faces with the same spacing as the linear array of devices, the mount also having an exterior major surface containing a linear array of parallel grooves which also extend between the end faces,
(b) providing an alignment jig which includes a base having a linear array of parallel grooves which are complementary to those in the mount and further includes an abutment positioned traverse to the base grooves,
(c) positioning the mount on the base so that the two arrays of grooves engage and the one end face of the mount is against the abutment,
(d) plancing the chip flush on the one end face of the mount so that one of its elongated edges is against the abutment, the height of the abutment being chosen so that the axes of linear arrays of fiber ends and of said devices are essentially parallel,
(e) while maintaining the axis coplanarity of step (d), positioning the chip so that the fiber ends and devices are aligned with one another, and
(f) affixing the chip to the one end face of the amount.

10. The method of claim 9 wherein positioning step (e) includes the steps of
(e1) positioning a microscope line over one of the fiber ends, and
(e2) positioning the corresponding device in alignment with the microscope line.

11. The method of claim 9 wherein positioning step (e) includes the steps of
(e1) providing the abutment with a serrated edge of grooves having the same spacing as the linear array of fiber ends,
(e2) providing the chip with a serrated edge of grooves complementary to those of the abutment, and
(e3) engaging the serrated edges so that the fiber ends and devices are aligned with one another.

* * * * *